United States Patent
Robinson et al.

(10) Patent No.: US 7,009,392 B2
(45) Date of Patent: Mar. 7, 2006

(54) METHOD OF ESTIMATING TARGET SIGNALS BY A DYNAMICAL FLUXGATE SENSOR

(75) Inventors: John W. C. Robinson, Stockholm (SE); Mattias F. Karlsson, Bandhagen (SE); Peter Sigray, Skärholmen (SE); Adi R. Bulsara, San Diego, CA (US); Luca Gammaitoni, Perugia (IT)

(73) Assignees: Totalforsvarets Forskningsinstitut, Stockholm (SE); The United States of America as represented by the Secretary of the Navy, Washington, DC (US)

( * ) Notice: Subject to any disclaimer, the term of this patent is extended or adjusted under 35 U.S.C. 154(b) by 3 days.

(21) Appl. No.: 10/482,999

(22) PCT Filed: Jun. 19, 2002

(86) PCT No.: PCT/SE02/01194

§ 371 (c)(1),
(2), (4) Date: Jan. 8, 2004

(87) PCT Pub. No.: WO03/007008

PCT Pub. Date: Jan. 23, 2003

(65) Prior Publication Data

US 2004/0183531 A1    Sep. 23, 2004

(30) Foreign Application Priority Data

Jul. 10, 2001    (SE) .................................... 0102475

(51) Int. Cl.
*G01R 33/04*    (2006.01)
(52) U.S. Cl. ..................................... 324/253
(58) Field of Classification Search ................ 324/244, 324/249, 251–253, 260, 222, 223
See application file for complete search history.

(56) References Cited

U.S. PATENT DOCUMENTS

| | | |
|---|---|---|
| 3,638,074 A | 1/1972 | Inouye |
| 4,267,640 A | 5/1981 | Wu |
| 4,321,536 A | 3/1982 | Rhodes |
| 4,864,238 A | 9/1989 | Seitz |
| 5,537,038 A | 7/1996 | Ando |
| 6,404,192 B1 | 6/2002 | Chiesi et al. |

FOREIGN PATENT DOCUMENTS

| | | |
|---|---|---|
| EP | 1 052 519 A1 | 6/1999 |

*Primary Examiner*—Bot LeDynh
(74) *Attorney, Agent, or Firm*—Jacobson Holman PLLC

(57) ABSTRACT

A method of estimating target signals (dc or low frequency signals) by a dynamical fluxgate sensor and a low-power fluxgate magnetometer operating according to the method. The sensor is pre-biased with a periodic bias signal in the form of a superposition of a square wave and a triangular wave. The change in residence time statistics in the stable state of the sensor is analyzed for estimating the target signals.

20 Claims, 9 Drawing Sheets

METHOD OF ESTIMATING TARGET SIGNALS BY A DYNAMICAL FLUXGATE SENSOR

This is a nationalization of PCT/SE02/01194 filed Jun. 19, 2002 and published in English.

BACKGROUND OF THE INVENTION

1. Field of the Invention

The present invention relates to a method of estimating dc or low frequency target signals by a dynamical fluxgate sensor and a low-power magnetometer operating according to the method. In this mode of operation of a fluxgate magnetometer we take advantage of the inherent nonlinear (bistable) character of the core dynamics itself. Our approach, based on the passage time statistics of transitions to the stable steady states of the hysteresis loop, offers the possibility of using bias signals that have lower amplitude and frequency than those used in conventional fluxgate operation.

2. Description of Related Art

Fluxgate magnetometers are currently used as practical and convenient sensors for room temperature magnetic field measurements. Conventional fluxgate magneto-meters show a bistable dynamics (resulting from hysteresis in the ferromagnetic core) that is exploited in order to operate the device as a magnetic field detector. Standard operation is performed by applying a known very large-amplitude, time-periodic bias signal, to drive the fluxgate dynamics between the stable states. In the absence of the target signal, the underlying potential energy function is symmetric, and the response features contributions from only the odd harmonics of the bias signal. The presence of a target signal (usually taken to be dc or very low frequency) skews the hysteresis loop, resulting in the appearance of all the harmonics (or, combination tones if the target signal is time-periodic) of the bias signal frequency in the fluxgate response, usually quantified via an output power spectral density. The spectral amplitude at any tonal frequency in the power spectrum can then yield the strength of the target signal, although in most applications the second harmonic of the bias signal is used since its spectral amplitude is proportional to the target signal amplitude as well as the bias frequency.

Conventional fluxgate readout schemes are limited by internal noise. Specifically, a large-amplitude, high frequency bias signal cant amounts of Barkhausen noise, and also: generate a strong 1/f component that degrades the sensor response. In addition, generating a bias signal of large amplitude and frequency requires a large power-source that severely limits the practical applicability of the sensor.

SUMMARY OF THE INVENTION

We describe here, an alternate approach wherein we operate the magnetometer in the presence of a time-periodic bias signal that is much smaller than the usual choice; this significantly reduces the on-board power requirements. Our technique involves the introduction of a bias signal whose amplitude in certain applications may vary between approximately twice the hysteresis loop-width and zero. It is of course always possible to use a bias signal with higher amplitude. The invention can be enabled with any time-periodic bias signal whose amplitude is user-adjustable, however preliminary research indicates that certain signal waveforms will yield better results than others.

In our readout scheme, we experimentally measure the residence (or crossing) times in the two stable states of the bistable potential energy function that underpins the core dynamics. With no noise, and only a time-periodic deterministic signal (having amplitude sufficient to cause switching between the steady states) driving the sensor, the two times will always remain constant, and equal to each other if the hysteresis loop (or the underlying potential energy function) is symmetric. The presence of a target signal (taken to be dc throughout this work) leads to a skewing of the loop with a direct effect on the residence times: they are no longer the same. In the presence of noise, the residence times must be replaced by their ensemble averages. The difference of the mean residence times can then lead to a quantification of the (unknown) target signal.

The above method of operation should work particularly well with the single-domain sensors now under development by IBM: J. Deak, A. Miklich, J. Slonczewski, R. Koch; Appl. Phys. Lett. 69, 1157 (1996), incorporated herein by reference. The unique geometry of these sensors leads to very narrow hysteresis loops, and the sensor noise is well approximated by correlated Gaussian noise. However, it is also applicable to conventional fluxgates. In fact, our preliminary investigations indicate that by adaptively controlling the bias signal amplitude, the degradation of the response by large amounts of sensor noise can be mitigated, and the response can also be rendered largely independent of the statistics of the noise.

The invention solves the problem of estimating dc or low frequency target signals by a dynamical fluxgate sensor by being designed in the way that is evident from the following independent claims. Other claims show suitable embodiments of the invention.

BRIEF DESCRIPTION OF THE DRAWINGS

The invention will be described in more detail in the following with reference to the accompanying drawings showing simulations results, where.

DETAILED DESCRIPTION OF THE PREFERRED EMBODIMENTS

Figure 1:
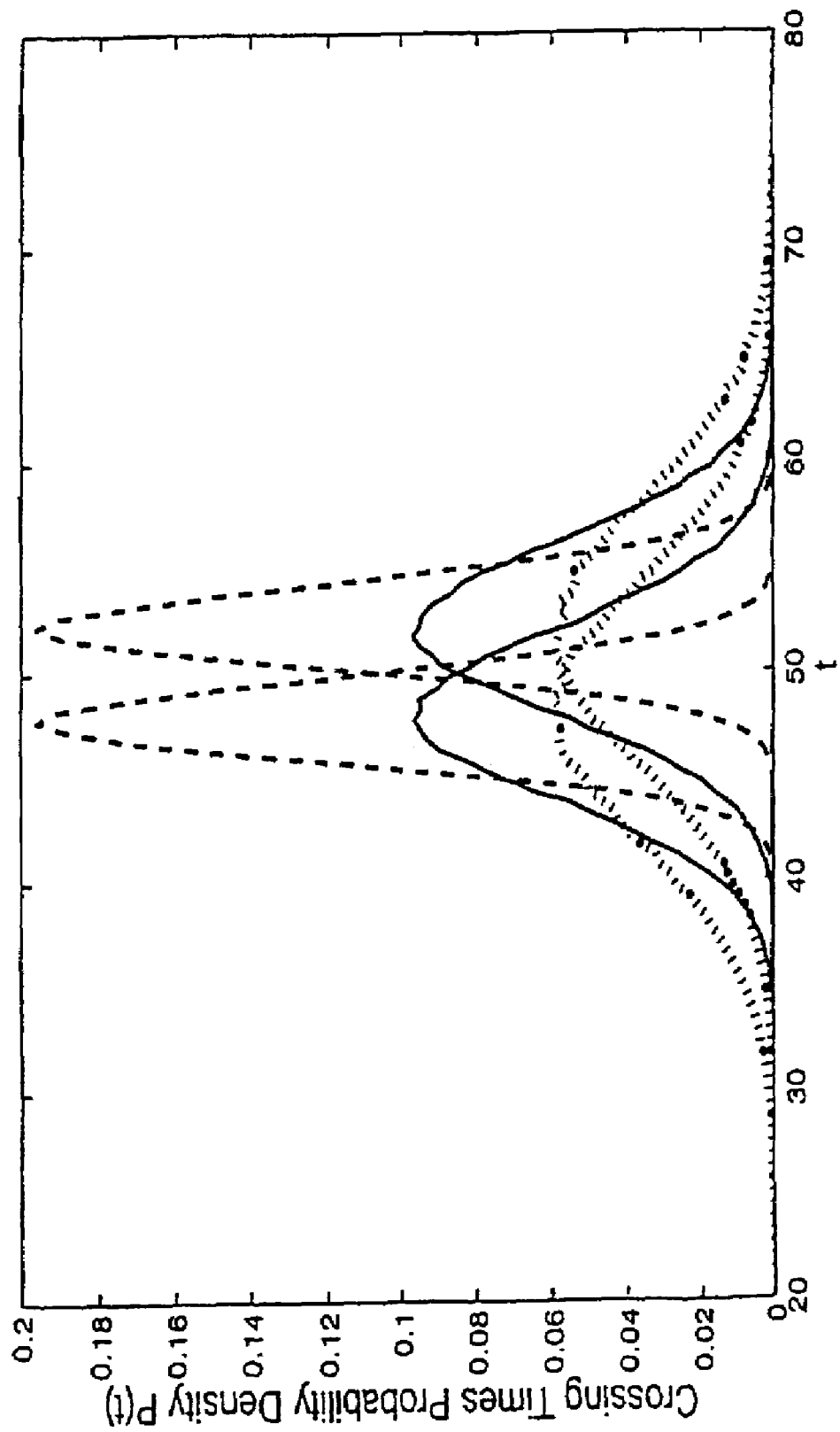
FIG. 1 shows Crossing Times Probability Densities CTPDs for the dynamics with target signal $H^{ext}=0.1$ and bias signal amplitude $H^{amp}=1.8$. Noise intensities are $\sigma^2=10$ (dashed curves), 50 (solid curves), and 150 (dotted curves). Noise correlation time $\tau_c=0.1$.

Further scope of applicability of the present invention will become apparent from the detailed description given hereinafter. However, it should be understood understood that the detailed description and specific examples, while indicating preferred embodiments of the invention, are given by way of illustration only, since various changes and modifications within the spirit and scope of the invention will become apparent to those skilled in the art from this detailed description.

In the following we introduce the fluxgate core model in its simplest form, and present results based on numerical simulations of the simplest model of hysteresis in the ferromagnetic core.

The ferromagnetic core is known to display hysteresis in its output, characterized by a magnetic induction B, vs. input, characterized by a magnetic induction $B_e = \mu_0 H_e$, where $\mu_0 = 4\pi \times 10^{-7}$ newtons/amp$^2$ is the free space permeability, with B measured in Tesla and H in amp/m. Then, taking $H_e = H^{ext} + H^{amp} \sin \omega t$ where $H^{ext}$ is a target signal (assumed to be dc) and $H^{amp} \sin \omega t$ a known i.e. controllable bias signal, one may write for the dynamics in the core:

$$\tau \dot{H} = f(H) + H_e + \zeta(t) \qquad (1)$$

where the overdot denotes the time-derivative, $\tau$ is a system time-constant (usually dependent on geometry, material and fabrication)that effectively sets the bandwidth (given by. $\tau^{-1}$) of the device, and $\zeta(t)$ is sensor noise which we take to be coloured Gaussian, having correlation time $\tau_c$. The core magnetic field H is related to the magnetic induction via $B = \mu_0 \mu_d H$, $\mu_d$ being an effective permeability that can depend on the core geometry and material. Then, the output voltage in a pickup coil of N turns with cross-sectional area A is given by $$V = -NA\frac{dB}{dt}$$

with B(t) obtained from the dynamics (1).

The core nonlinearity f(H) is taken to be cubic, corresponding to the gradient of a bistable potential energy function:

$$U(H) = -\frac{a}{2}H^2 + \frac{b}{4}H^4;\ f(h) = -\frac{\partial U}{\partial H} \qquad (2)$$

with the constants a and b measured experimentally, or determined at fabrication.

Level crossing statistics that analyze the time intervals in-between transitions to the stable states of the potential energy function (or, equivalently, the saturation states of the hysteretic output-input characteristic) are becoming an increasingly important part of the signal processing suite for nonlinear dynamical systems. Part of this interest stems, of course, from the neural coding repertoire: neurophysiologists believe that the point process generated by successive "firing" events contains all the relevant information about the stimulus that leads to the firing. Under the appropriate conditions, namely a renewal character to the spike train (successive spikes are uncorrelated) it is possible to connect the "Inter-Spike Interval Histogram" (also known as the Crossing Times Probability Density, CTPD) to the output power spectral density. Even without this connection, though, the interval histogram and its moments, do provide a valuable signal processing tool in their own right; we now apply them to the fluxgate problem.

For the potential (2), the stable states (i.e., the potential minima or the hysteresis loop saturation states) occur at H=± $\sqrt{a/b}$, and the energy barrier separating them is $$U_0 = \frac{a^2}{4b}.$$

With a dc (or extremely low frequency, almost adiabatic) driving signal, one can incorporate the effects of the signal by augmenting the potential with a term $-H^{ext}H$; then, the deterministic switching threshold (the minimal signal amplitude required to make one of the minima completely disappear, to be replaced by a point of inflexion) can be found by equating U'(H) to zero (the prime denotes differentiation with respect to ho and forcing the resulting cubic to have only a single real root. This yields a critical amplitude $$H_c^{ext} = \sqrt{\frac{4a^3}{27b}}$$

for the deterministic crossing threshold: an input signal having amplitude just greater than $H_c^{ext}$ will make one of the stable states in the potential disappear. In the presence of a time-periodic signal, the deterministic switching threshold becomes frequency-dependent. At the level of the hysteresis loop, this has already been thoroughly investigated: the hysteresis loop area depends on the frequency of the driving signal, in fact it is peaked at a critical frequency, whose value depends on the signal amplitude, as well as the hysteresis loop parameters a and b, the time-constant $\tau$, and the sample temperature.

In the absence of the target signal $H^{ext}$=0 and for the noiseless case, the bias signal periodically "rocks" the potential. If the signal amplitude $H^{amp}$ exceeds the deterministic switching threshold, the state-point will make, successively, transitions to the two stable states at deterministic (well-defined) times separated by a half-cycle of the bias signal. No information is contained in these switch events beyond the (in our case) already known bias signal frequency and amplitude; the switch events are quite regular.

Now consider the noisy case; throughout this work we will assume that the noise is Gaussian correlated, i.e., it is derived from a white-noise driven Ornstein-Uhlenbeck process:

$$\dot{\zeta}(t) = -\tau_c^{-1}\zeta + \sigma F(t) \qquad (3)$$

where F(t) is a white noise process having zero mean and unit variance: <F(t)>=0, and <F(t)F(t')>=$\delta$(t-t'). We readily obtain for the correlation function of the coloured Gaussian noise, $<\zeta(t)\zeta(t')>=<\delta^2>\exp[-|t-t'|/\tau_c]$ where $<\zeta^2>=\sigma^2\tau_c/2$. We also assume that the signal frequency $\omega$ is well within the noise band, i.e. the noise is wideband vis à vis the signal. We reiterate that this is a good assumption for the noise statistics based on the latest results on single domain fluxgates, and it will become evident, in fact, that it may be possible to somewhat mitigate problems arising from the noise statistics by adaptively increasing the signal amplitude in real scenarios.

For $H^{ext}=0$ and $H^{amp}$ suprathreshold, the threshold crossings to the stable states are controlled by the signal, but the noise does introduce some randomness into the inter-spike intervals. The result is a broadening of the CTPD, due to the noise. For $H^{amp}$ far above the deterministic switching threshold and moderate noise, the CTPD assumes a symmetric narrow (Gaussian-like) shape with a mean value (the mean crossing time) nearly the same as the most probable value or mode (this is the value around which most experimental observations are likely to be clustered). The mean values (or modes, in this case) of the histograms corresponding to transitions to the left and right stable states coincide. As the signal amplitude decreases and/or the noise intensity increases, the CTPD starts to develop a tail so that the mean and mode get separated; the appearance of the tail is an indication of the increased role of noise in producing switching events, although the suprathreshold signal is still the dominant mechanism. When the signal amplitude falls below the deterministic crossing threshold, the crossings are driven largely by the noise. The CTPD can assume a characteristic multi-peaked structure that shows "skipping" behaviour since the noise can actually cause the crossings to occur at different multiples $nT/2$ ($T=2\pi/\omega$, n odd) of the half-period, and the Stochastic Resonance scenario comes into play through a synchronization of characteristic timescales in the system; the noise determines the tail of the CTPD, and introduces a broadening, or dispersion, in individual lobes of the CTPD, since the individual crossing events do not always occur precisely at times $nT/2$.

It is, therefore, important to note that with zero target signal, the crossing statistics to the left or right minimum of the potential, are identical, with coincident CTPDs, as should be expected. However, let us now consider the case of a nonzero but small target signal, $H^{ext} \ll U_0$ in the presence of coloured noise and the (assumed suprathreshold) bias signal $H^{amp}\sin\omega t$. The following observations can then be made:

1. The potential $U(H)$ is now a priori skewed even for $H^{amp}=0$. Hence, the mean crossing times (under the noise and bias signal) to the two stable states will be different. Denote these times by $<t_1>$, $<t_2>$ respectively (the brackets denote an ensemble average).

2. For very large bias signal amplitudes and moderate noise intensity ($\sigma^2 \leq U_0$), the CTPDs are two well-separated Gaussian-like distributions (since $t \geq 0$ the distributions are not strictly Gaussian) centred about modes $<t_{1,2}>$; for signal amplitudes much larger than the rms noise amplitude, the distributions become broader, and start to develop tails as the bias signal amplitude drops to the deterministic switching threshold and below, with separated modes and means.

3. The separation $\Delta t = |<t_1>-<t_2>|$ of the mean values yields a direct measure of the asymmetry-producing target signal. Theoretical calculations of this quantity are currently underway, but numerical simulations are shown in the following section. For an a priori balanced magnetometer (i.e. symmetric hysteresis loop), in fact, the existence of a non-zero $\Delta t$ can be taken as a sign of the presence of the target signal.

4. In the presence of increasing amounts of noise the CTPDs tend to merge and their mean values (which are now well-separated from the modes) also may be difficult to distinguish, since $\Delta t \to 0$ with increasing noise. However, increasing the bias signal amplitude (this could be done adaptively in a real application) once again leads to the signal as the dominant mechanism for crossing events and the distributions "sharpen" and have less overlap, becoming more resolvable, even though the separation $\Delta t$ may actually decrease.

5. For subthreshold bias signals, the crossing events are noise-dominated and the CTPDs multimodal in general. The Stochastic Resonance scenario may be exploited to yield better signal processing. This case has been discussed, in connection with a different class of sensors, in: A Bulsara, M. Inchiosa, L. Gammaitoni; Phys. Rev. Lett. 77, 2162 (1996). M. Inchiosa, A. Bulsara; L. Gammaitoni; Phys. Rev. E55, 4049 (1997). M. Inchiosa, A. Bulsara; Phys. Rev. E58, 115 (1998), all incorporated herein by reference. Subthreshold bias signals will lower the power consuption and is therefore an interesting class of driving signals, but since the performance analysis is similar to the one in the mentioned papers we do not address it further here.

6. For very special situations (primarily those in which there is a very small amount of noise), one can carry out the above procedure with a very weak bias signal. In this case the CTPDs are unimodal with long tails. The mean values and modes are, again, dependent on the target signal; however, in this case, the slopes of the long-time tails of the density functions are different for the two wells, and this difference can also be used as an identifier (if needed) of the target signal. The limiting case of zero bias signal is also being studied. Preliminary (simulated) results indicate that this operating mode is optimal even for small target signals. Of course, in pratical applications, the presence of assorted (often non-Gaussian and non-stationary) noise sources, the fact that the hysteresis loop area (or configuration) can be a function of the bias signal, as well as readout issues, could make the zero-bias signal readout a possibility for only very specialized scenarios.

7. Preliminary calculations indicate that a sinusoidal bias signal is not optimal; much better sensitivity may be obtained by using other signal waveforms (e.g. triangular), which have a stepwise linear behaviour.

Note that in an experiment, under any of the above scenarios, it is not necessary to actually compute the CTPDs. One simply accumulates a large number of crossing times for the two saturation states of the hysteresis loop, and computes the arithmetic mean for each set of times. Then, an important issue is the amount of data (dependent on the response time of the electronics as well as the amount of time one can "look" at the target signal, as well as the bias frequency $\omega$) required to obtain reliable estimates of $\Delta t$. It is clear that increasing the bias signal amplitude (so as to better-discriminate the CTPDs) can lead to enhanced detection probabilities. In this context, it is important to point out that the above technique may be implemented with bias signal amplitudes that are not substantively larger than the potential barrier height, and also with relatively low bias frequencies (on the order of a kilohertz; this is true particularly for the new fluxgates having mainly Gaussian correlated noise and small 1/f risers). In practice, however, one should expect to confront a tradeoff between the bias signal amplitude (this is a function of the on-board power in a practical sensor) and the concomitant degree of resolution of the peaks of the histograms, and what is necessary for a reliable (usually with a limited observation time) estimate of the target signal from Δt. In the next section we show the results of numerical simulations with bias signal amplitudes approximately 1.5 times the potential barrier height. In turn this leads to a significantly smaller on-board power constraint, which is one of the limiting drawbacks to current fluxgates.

Figure 2:
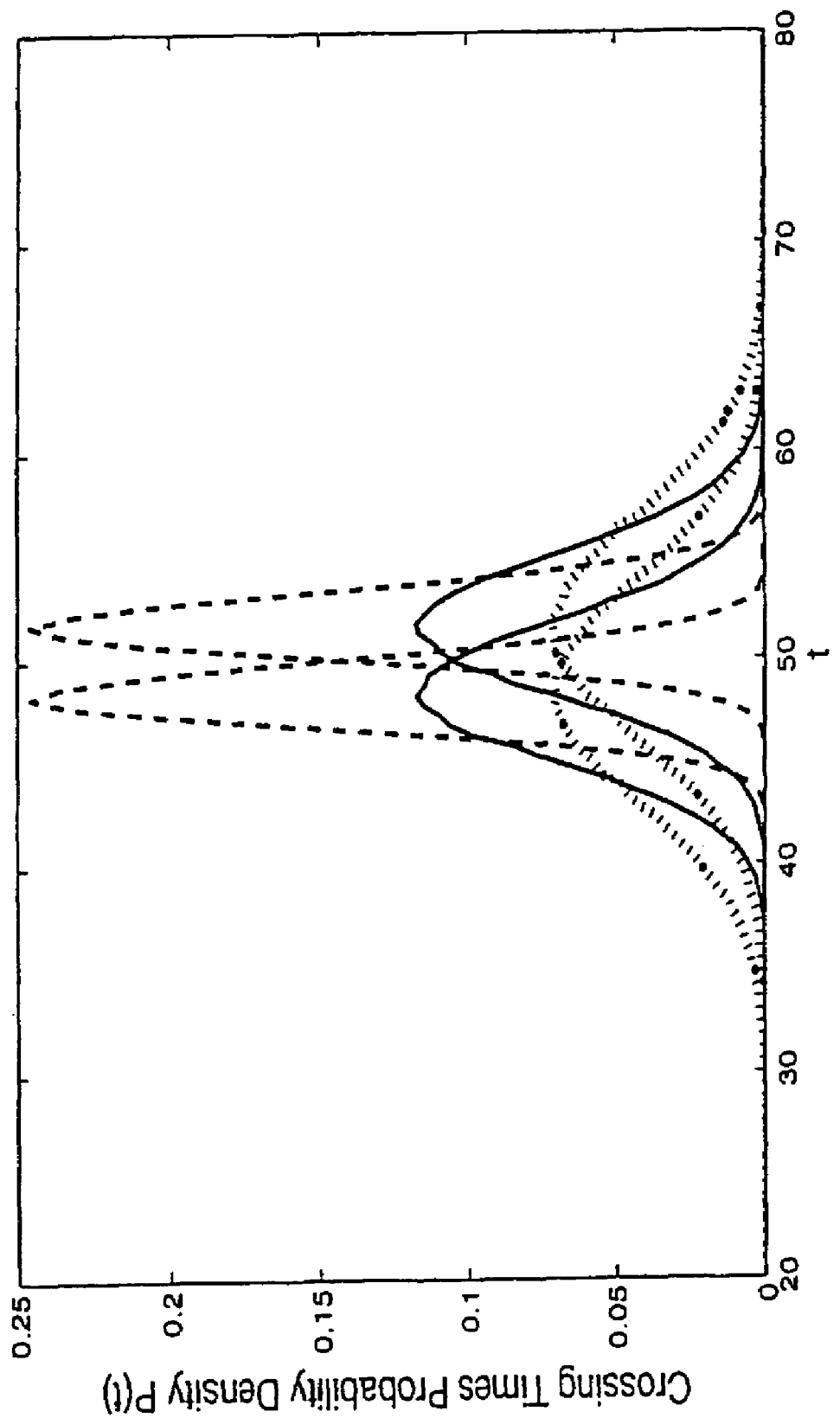
FIG. 2 shows the same as in FIG. 1 but with $H^{amp}=2.2$.

We now present, simulations carried out on a bistable system with an underlying potential function of the form (2). We set a =1, b=⅙ so that the barrier height is. $U_0$=1.5 in the absence of any external signals. In FIGS. 1 and 2, we compute and plot the CTPDs for different noise strengths and two different values (both supra-threshold) of the bias signal amplitude. The target signal amplitude is held constant $H^{ext}$=0.1 in both plots. The time constant τ of real devices, is usually about $10^{-8}$ so that in the simulations, the signal frequency and noise band are all adjusted to lie well within the instrument bandwidth $\tau^{-1}$ (for theoretical calculations this implies that one may represent the fluxgate as a "static" nonlinearity and simply track the noise and signal dynamics as they pass through the system). Under these conditions, the results for different signal frequencies (as long as $$\frac{\omega}{2\pi} << \tau^{-1})$$

are very similar; for frequencies larger than $\tau^{-1}$, however, dynamical hysteresis effects can become more important. Note that the frequencies we apply are on the order of kHz and lower and that they therefore always are well within the instrument bandwidth.

It is clear that the two distributions are symmetric for small noise intensities, but tend to become asymmetric with increasing noise. The mean values are well-separated for larger bias signals (or, equivalently, smaller noise intensities); as discussed earlier, for the more symmetric CTPDs, the mean values are very close to the modes (or peaks) of the distributions. Increasing the noise tends to make the distributions asymmetric and Δt becomes smaller; however, the figures clearly show that increasing the bias signal amplitude makes the distributions more "uresolvable", even though Δt decreases with increasing $H^{amp}$.

Figure 3:
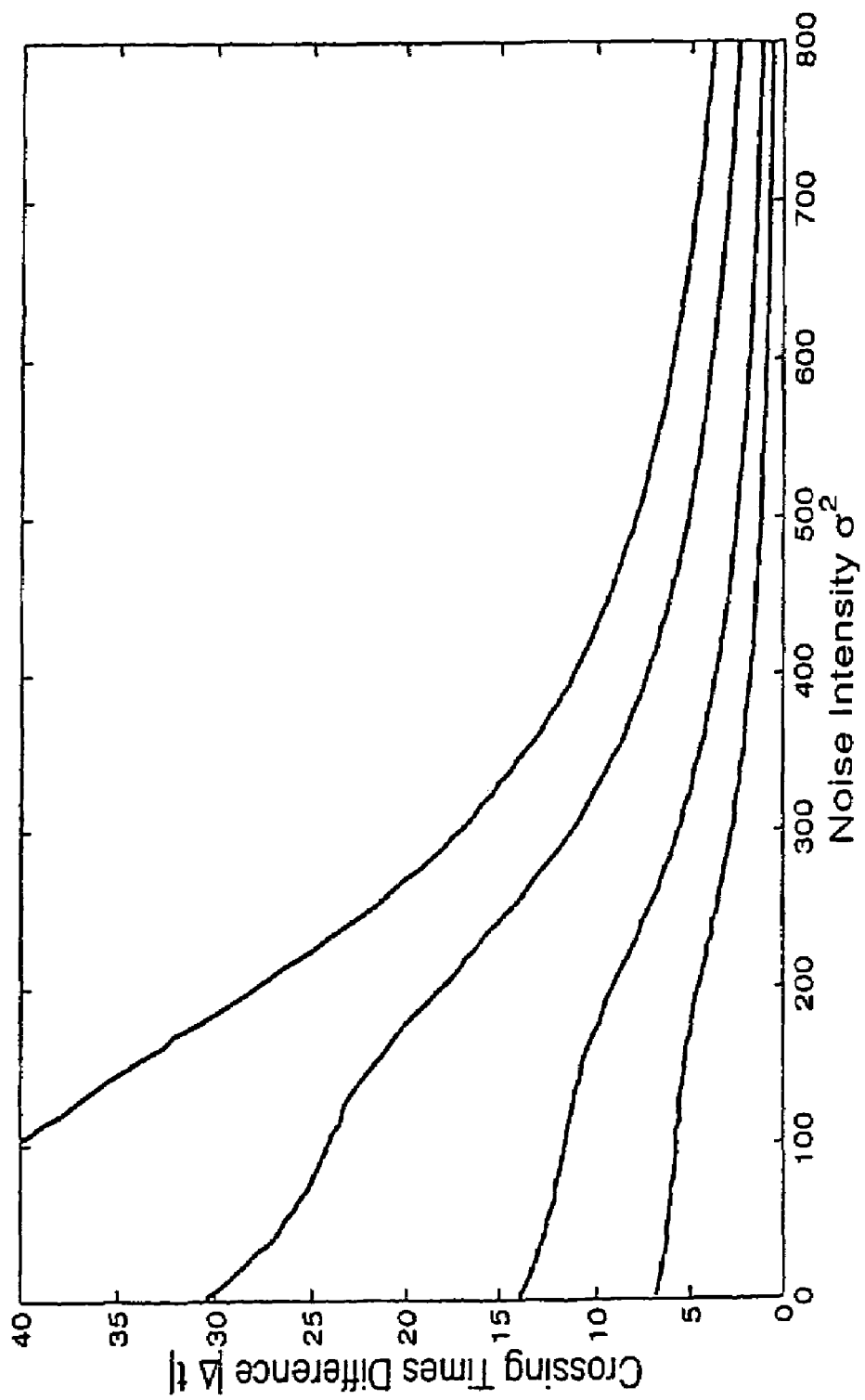
FIG. 3 shows difference $\Delta t \equiv |<t_1> - <t_2>|$ vs. noise intensity $\sigma^2$. Bias signal amplitude $H^{amp}=1.8$ and curves (top-to-bottom) correspond to target signals $H^{ext}=0.9, 0.6, 0.3, 0.15$ respectively. Noise correlation time $\tau_c=0.1$.
Figure 4:
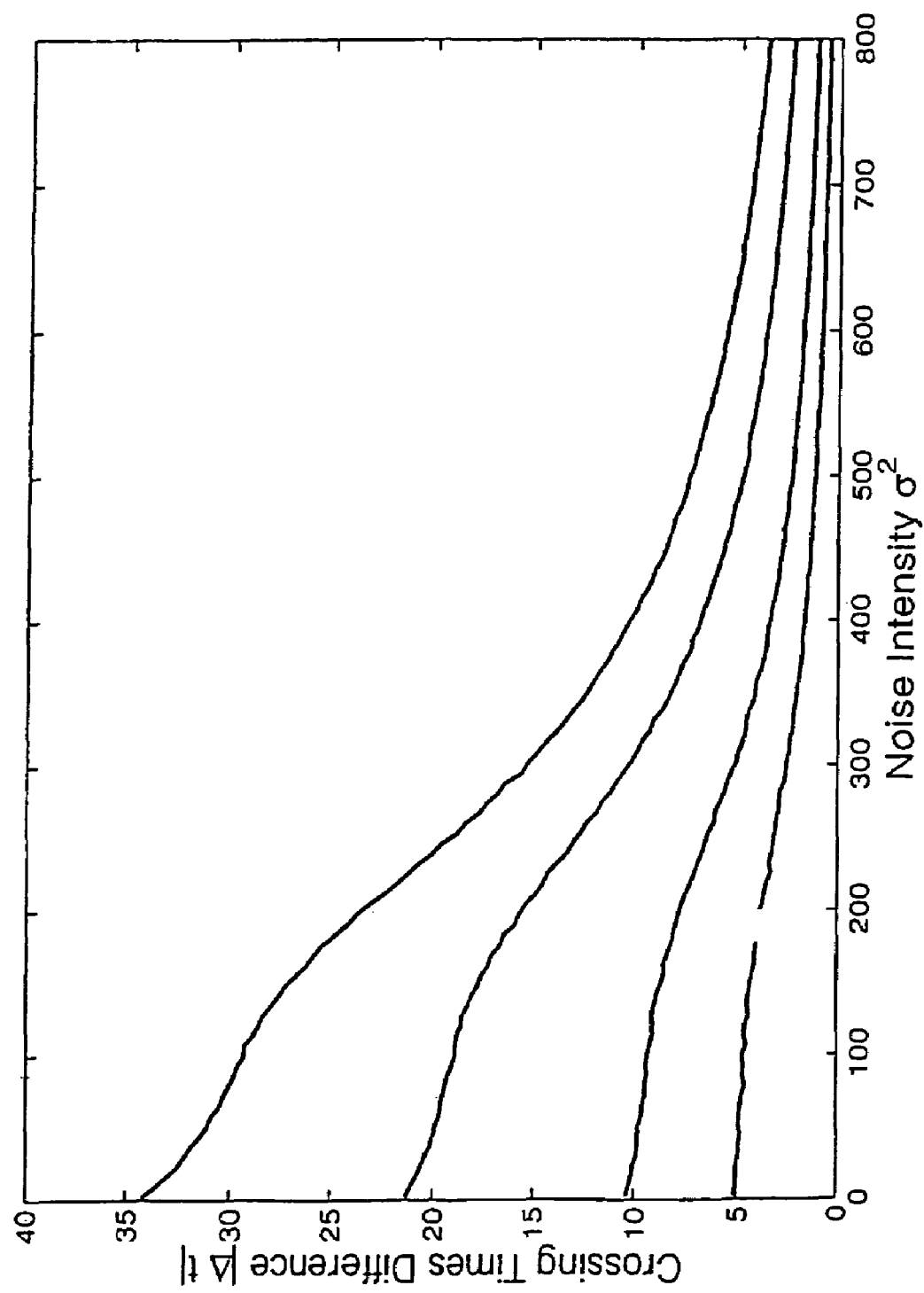
FIG. 4 shows the same as in FIG. 3, but with $H^{amp}=2.2$.

The mean values of the distributions yield the mean passage times to the two stable states of the potential function, as described earlier. These mean times are shown in FIGS. 3 and 4. The same target signal amplitudes are used in the two figures, but the bias signal amplitude is different for the two cases. Several features are apparent in these plots:

1. At very large noise, Δt approaches zero. This is expected (see comments above), with the distributions overlapping more and more with increasing noise. The approach to zero is slower for larger target signals because of the larger asymmetry in the potential that they bring.

2. At vanishingly small noises, Δt is almost flat (for small target signals) and shows a monotonic decrease with increasing noise. At zero noise (not shown on the plots) the curves would intersect the vertical axis at the deterministic difference Δt.

3. Increasing the bias-signal amplitude reduces Δt even as it renders the distributions more resolvable for large noise. This indicates that in a practical application, it may not necessarily be of benefit to apply an extremely large bias signal; our simulations show that for bias signals having amplitude not much larger than the barrier height will suffice (FIGS. 1 and 2 demonstrate this point nicely). Of course, exceptional cases e.g., large noise, or non-Gaussian and/or non-stationary noise, may necessitate the application of larger drive signals.

In order to illustrate how to choose the bias signal and how to analyze the residence times, we have analytically analyzed the dynamics of the core with stochastic perturbation theory. The dynamics in the ferromagnetic core (1), which describes the relationship between the magnetic induction B and the magnetic field H, can for an assumed white noise be rewritten as $$dB_t=(aB_t-bB_t^3+H_t^{bias}+H_t^{ext})dt+\sigma dW_t \qquad (4)$$

where σ is a noise constant and $W_t$ is the standard Wiener process. Even though our magnetometer can be driven with any kind of periodical bias signal we start by analyzing the often used sinusoid, $H_t^{bias}=H^{amp}\sin \omega t$. To facilitate the calculations we also assume the target signal $H_t^{ext}$, to be constant instead of having a low frequency. Obviously the noise creates varying residence times from the stable states, and our magnetometer can base its readout on the average difference of the residence times. In order to quantify the quality of this approach we need to calculate the pdf:s for the residence times in equation (4), which can be done by applying a stochastic perturbation expansion (at least if the noise level is assumed to sufficiently small).

If we let ξ be the formal time derivative of the Wiener process W, the solution $B^{(o)}$ to the equation for the core dynamics (4) satisfies an ODE of the form, $$\dot{B}_t^{(o)}=g(B_t^{(o)},\sigma\xi_t), B_0^{(o)}=z_0 \qquad (5)$$

where $$g(x,\sigma y)=f_1(x)+f_2(\sigma y)=ax-bx^3+H^{bias}+H^{ext}+\sigma y, x\in R, y\in R \qquad (6)$$

In order to arrive at a sequence of approximations to the solution $B^{(o)}$ to (4) we assume that the nose constant σ is small and make the following perturbation ansatz. We expand, formally, the solution $B^{(o)}$ to (5) in powers of σ as $$B_t^{(\sigma)}=B_t^{(0)}+\sigma B_t^{(1)}+\ldots+\sigma^k B_t^{(k)}+\ldots \qquad (7)$$

and expand accordingly also the right hand side of (5) in powers of σ. If we then equate coefficients on both sides of the arisen equality $$\dot{B}_t^{(0)}+\sigma\dot{B}_t^{(1)}+\ldots = g(B_t^{(0)},0)+$$
$$\sigma\left(\frac{\partial g(B_t^{(0)}+\sigma B_t^{(1)}+\ldots,\sigma\xi_t)}{\partial\sigma}\bigg|_{\sigma=0}\right)+\ldots$$
$$= g(B_t^{(0)},0)+\sigma((a-3bB_t^{(0)})B_t^{(1)})+\xi_t)+\ldots,$$

the following differential equations for the correction terms (functions) emerge $$\dot{B}_t^{(0)}=g(B_t^{(0)},0),$$

$$dB_t^{(1)}=((a-3bB_t^{(0)})B_t^{(1)})dt+dW_t \qquad (8)$$

where the initial conditions are $B_0^{(0)}=z_0$, $B_0^{(1)}=0, \ldots$. The details for the higher order corrections (for k≧2) are easily calculated. Since (5) is linear in ξ, all of the equations in (8) are linear in ξ, and it therefore follows that the vector process $B^{k-1}=(B^{(0)},\ldots,B^{(k)})^T$ obtained by considering simultaneously the k+1 first corrections in (8), represents, formally, an SDE. In M. I. Freidlin and A. D. Wentzell, "Random Perturbations of Dynamical Systerms", 2nd ed., Springer, 1998, incorporated herein by reference, it is shown that if the components of $f_1$ and $f_2$ in (6), have bounded partial derivatives up to k+1:th order (inclusive), then the SDE for $B^{k+1}$ is in fact well-defined with a strong solution, and the expression $$\sum_{i=0}^{k} \sigma^k B^{(k)}$$

is an approximation to $B^{(\sigma)}$ for which the error is asymptotically small in mean square as $\sigma \to 0$. Resting on this result we can henceforth write a k:th order expansion as in (7) as $$B_t^{(\sigma)} = B_t^{(0)} + \sigma B_t^{(1)} + \ldots + \sigma^k B_t^{(k)} + O(\sigma^{k+1}) \qquad (9)$$

where the remainder term is primarily to be interpreted as asymptotically small in a mean square sense.

From (8) we see that the zero:th approximation is simply the deterministic ODE that would be obtained upon setting. $\sigma=0$ in (4) and the first order approximation is obtained by linearizing (4) around the nominal deterministic trajectory obtained from the zero:th approximation. We study the first order approximation and suppose that (9) holds for k=1 and that $z_0$ is an interior point of a domain D in R such that the first exit time $t_0$ of the process $B_t^{(0)}$ from D is finite. If we then denote the first exit time of the process $B_t^{(\sigma)}$ from D by $\tau_\sigma$, we have, if ($\dot{B}_{t_0}^{(0)} > 0$), $$\tau_\sigma = t_0 + \sigma \frac{B_{t_0}^{(1)}}{\dot{B}_{t_0}^{(0)}} + O(\sigma),$$

where the remainder term should be interpreted in the sense chosen in (9). Since W is a Gaussian process, so is the first order approximation. The (unique) solution to the second equation in (8) is namely well-known to be $$B_t^{(1)} = \int_0^t e^{\int_s^t (a - 3bB_u^{(0)}) du} dW_u.$$

Therefore the crossing time $\tau_\sigma$ will approximately be a Gaussian variable with mean $t_0$ and a variance $$V(\tau_\sigma) = V\left(\sigma \frac{B_{t_0}^{(1)}}{\dot{B}_{t_0}^{(0)}}\right) = \frac{\sigma^2}{\dot{B}_{t_0}^{(0)}} V(B_{t_0}^{(1)}), \qquad (10)$$

where $\dot{B}_t^{(1)}$ is deterministic. Since the variance of $B_{t_0}^{(1)}$ by standard properties of stochastic integrals can be written as $$E[(B_{t_0}^{(1)})^2] = \int_0^{\tau_0} \left(e^{\int_{us}^{t_0 t}(a - 3bB_t^{(0)}) dt}\right)^2 du,$$

relation (10) can be rewritten as $$V(\tau_\sigma) = \frac{\sigma^2}{(\dot{B}_{t_0}^{(0)})^2} \int_0^{\tau_0} (e^{\int_{us}^{t_0 t}(a - 3bB_t^{(0)}) dt})^2 du. \qquad (11)$$

Numerical investigations show a very good agreement between these calculated residence times pdf:s and Monte Carlo simulated pdf:s, for small noise levels.

Figure 5:
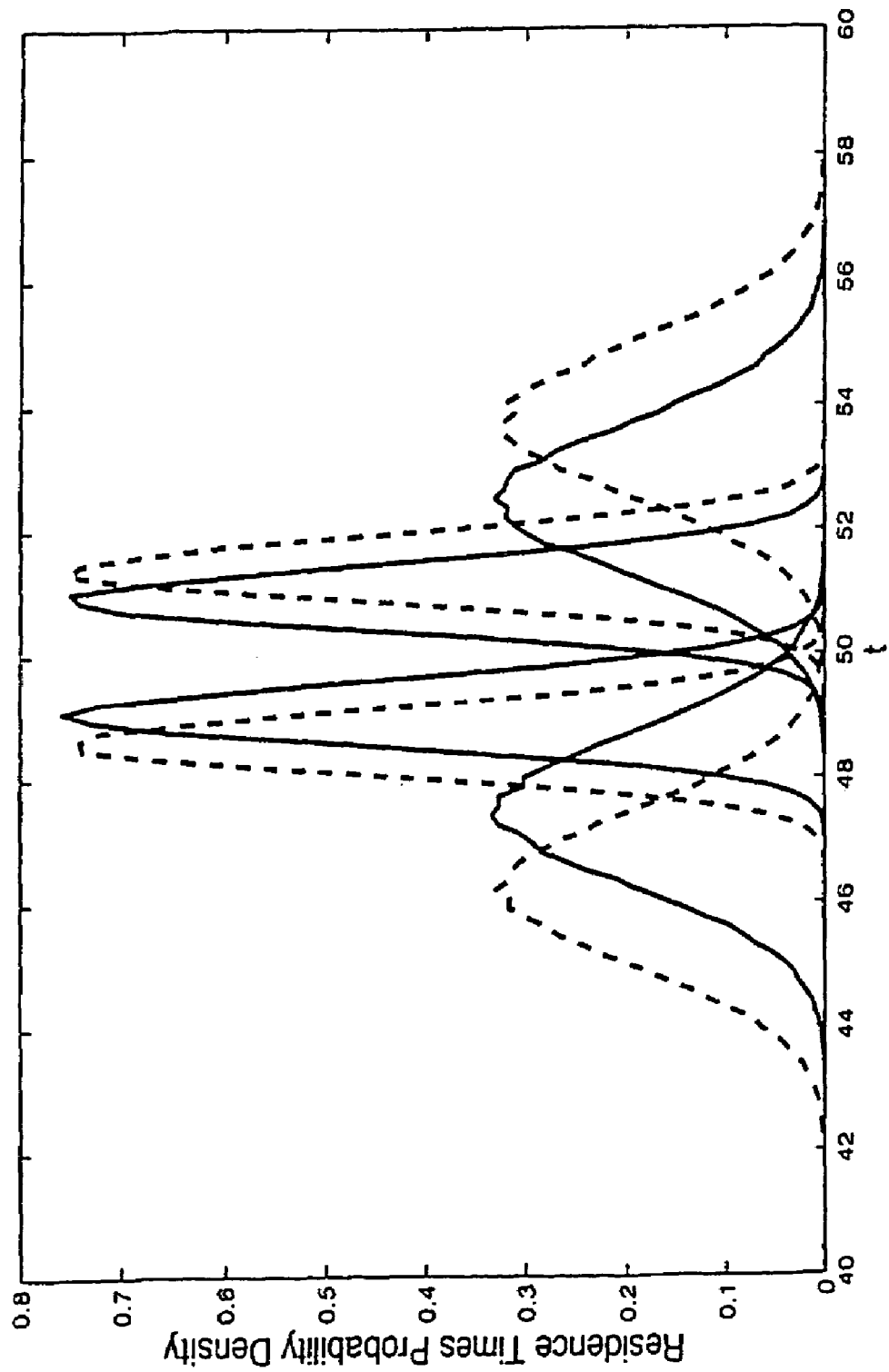
FIG. 5 shows the residence times pdf:s for two different bias signals, 1.5 (corresponding to the wide pdf:s) and 3.0 (corresponding to the sharp pdf:s), and two different target signals, 0.08 (solid lines) and 0.12 (dashed lines). The other parameter values are $a=1$, $b=\frac{1}{6}$, $\omega=2\pi \cdot 0.01$, and $\sigma=\sqrt{2 \cdot 10^{-2}}$.

An intuitive approach to reduce the error of the estimate of the target signal would be to minimize the variance of the residence times. However, by lowering the residence times variance (following from e.g. an increase of the bias signal amplitude) we also decrease the difference of the mean times when the target signal is varied. This effect can be seen in FIG. 5, where the residence times pdf:s are shown for two bias signals and two target signals. Hence, the lowering of the variances of the residence times automatically demands better precision of the measurements, and it is therefore not obvious in this setting whether the performance is increased with the bias signal amplitude or not. A standard approach to solve such an issue, is to define the optimal setting as the one, which among all estimators (consistent in probability), gives the lowest variance of the estimate of the target signal, given the switching times for a fixed time interval. A further advantage of this optimization criterion is that it should also be possible to make future comparison between the pulse position based approach and the conventional approach.

Figure 6:
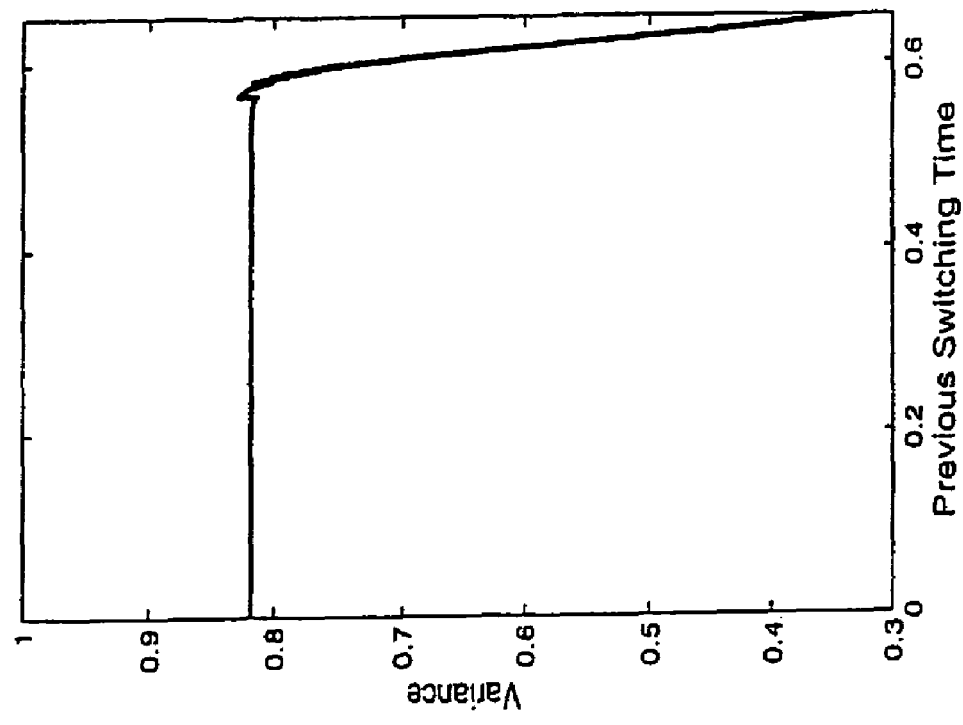
FIG. 6 shows the mean and variance for a switching time versus the previous switching time. Both the previous switching time and the mean for the following switching time are measured in units of the period time T, and correspond to a bias signal $H^{amp} \sin \omega t$. The parameter values for the system are as in FIG. 5 with $H^{amp}=1.5$ and $H^{ext}=0.08$.
Figure 6:
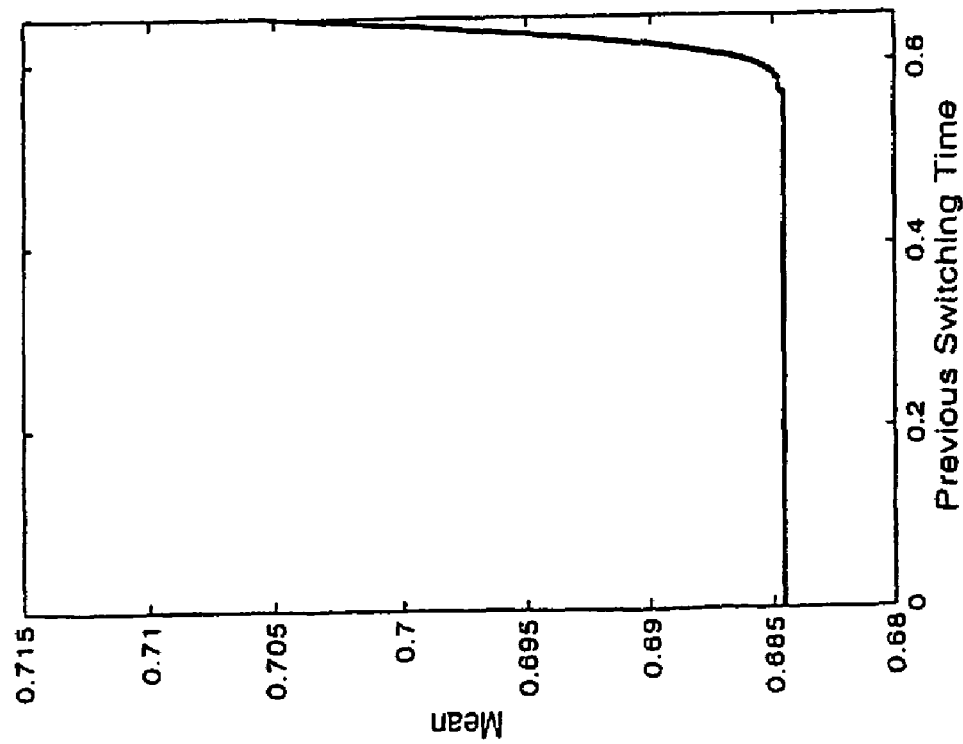

An important observation that facilitates the performance analysis is the approximative independence of switching times, for low noise intensities. In addition all observed times where the system switches from one of the stable states to the other seem to be equally distributed except by a mean value difference of iT, where T is the period time and $i \in Z$ (and similarly for the switching from the other state back to the first). Hence all switching times are approximately independent and identically distributed, which can be shown both analytically and numerically. Here we use the latter approach by computing the mean and variance of a switching time versus the previous switching time. Since we know the switching times distributions to be Gaussian no higher moments need to be considered. These computations are presented in FIG. 6, from where it is fairly obvious that both the mean and the variance are independent of the previous switching time.

The only exception of the assumed independence would be for previous switching times larger than 0.55 T, corresponding to a negative bias signal. However, for the noise levels under consideration such previous' switching times would be extremely rare since this state normally is reached for a very positive bias signal (i.e. close to T/4).

Further numerical investigations indicate a very linear like dependence between the target signal and the displacement of switching times i.e.

$$H^{ext} = \mu c \qquad (12)$$

where $\mu$ is the change of switching time and c is a constant. The switching times independence therefore renders the possibility of extracting the optimal achievable limit for any kind of estimator based on switching times. If we define $\bar{u}_i$ and $\bar{d}_i$ as $\bar{u}_i = u_i - u_0 \mod(T)$ and $\bar{d}_i = d_i - d_0 \mod(T)$, where $u_i$ and $d_i$ are the two different switching times, from one state to the other, and from the second back to the first, $u_0$ and $d_0$ are the first switching times in a system without noise and target signal, we get, $\mu = \mu_u = \mu_d$ (where $\mu_u = E(\bar{u}_i)$ and $\mu_d = E(\bar{d}_i)$) and $\sigma = \sigma_u = \sigma_d$ (where $\sigma_u^2 = V(\bar{u}_i)$ and $\sigma_d^2 = V(\bar{d}_i)$). The set $\{\bar{u}_1,$ $\bar{u}_2, \ldots, \bar{u}_{n+1}, -\bar{d}_1, -\bar{d}_2, \ldots, -\bar{d}_n\}$ will then consist of 2n+1 independent identically distributed Gaussian variables with mean $\mu$ and variance $\sigma^2$. In this case we know from (12) that the minimum variance estimator of $H^{ext}$ is given by $$\bar{H}_{opt}^{ext} = \frac{\sum_{i=1}^{n+1} \bar{u}_i - \sum_{i=1}^{n} \bar{d}_i}{2n+1} c,$$

with a variance $$V(\bar{H}_{opt}^{ext}) = \frac{c^2 \sigma^2}{n+1} \quad (13)$$

which is easily proved by e.g. the information equality. For implementation of future experiments, however, the usage of the quantities $u_0$ and $d_0$ forces the instrument to relate the switchings to the bias signal. Since this considerably complicates the experiments the alternative approach based on residence times would be preferable, and we therefore here derive its performance capacity and compare it to the optimal limit.

As mentioned earlier, the displacement of the switching times varies linearly with the target signal and in the optimal approach we therefore calculated the estimate by multiplying the measured mean displacement with c. The alternative approach measures mean difference in residence times $\Delta t$, and since a displacement $\mu$ for the switching times results in a mean residence time difference of $4\mu$ the estimation of the target signal becomes $$\bar{H}_{alt}^{ext} = \frac{c}{4} \Delta t,$$

where $$\Delta t = \frac{1}{n}\left(\sum_{i=1}^{n}(d_i - u_i) - \sum_{i=1}^{n}(u_{i-1} - d_i)\right).$$

The variance of the alternative estimator will then be $$V(\bar{H}_{alt}^{ext}) = V\left(\frac{\Delta t}{4}\right) = \frac{c^2}{16} V(\Delta t)$$

where $$V(\Delta t) = V\left(\frac{1}{n} \sum_{i=1}^{n} (2d_i - u_i - u_{i+1})\right),$$

which if we define $Y_i = 2d_i - u_i - u_{i+1}$, becomes $$V(\Delta t) = V\left(\frac{1}{n}\sum_{i=1}^{n}(Y_i)\right) = \frac{1}{n^2}\left(\sum_{i=1}^{n} V(Y_i) + \sum_{i \neq j}\sum_{j=1}^{n} \text{Cov}(Y_i, Y_j)\right)$$

which by straight forward calculations can be shown to be $$V(\Delta t) = \frac{8\sigma^2}{n} - \frac{2\sigma^2}{n^2}.$$

Hence, the estimator of the alternative approach has the variance $$V(\bar{H}_{alt}^{ext}) = \frac{c^2}{16}\left(\frac{8\sigma^2}{n} - \frac{2\sigma^2}{n^2}\right) = \frac{c^2\sigma^2}{2n} - \frac{c^2\sigma^2}{8n^2},$$

and is therefore slightly worse than the optimal estimator, see (13), although it performs asymptotically as good for large n and is much easier to implement in an, experiment.

Figure 7:
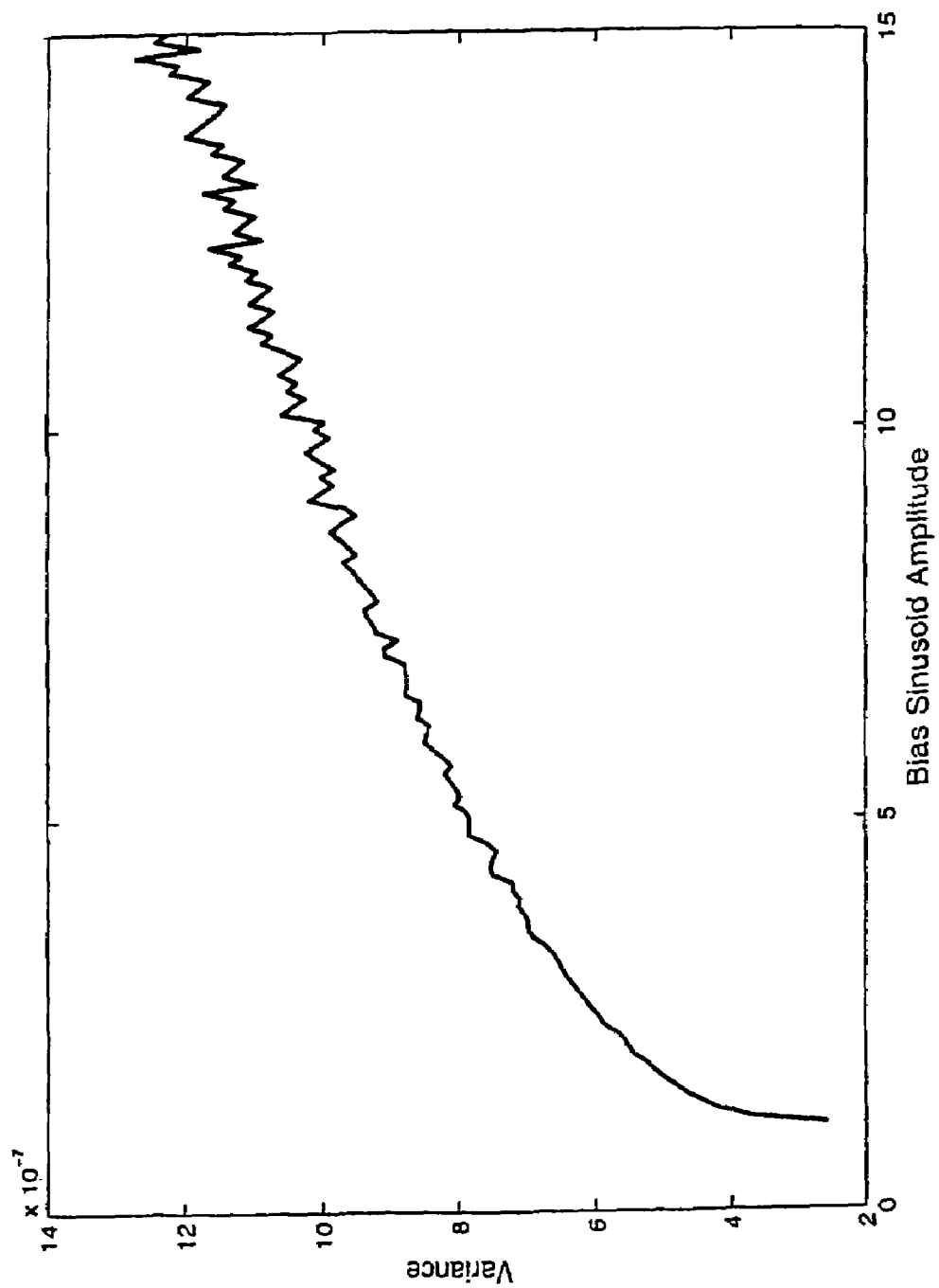
FIG. 7 shows the minimal possible achievable variance of the estimate for all pulse position based fluxgate magnetometers as a function of the applied sinusoid bias signal amplitude. The system parameters are as in FIG. 6 except for the noise level $\sigma=0.05$, and the number of samples are $n=100$.

As mentioned earlier it is not obvious which sinusoid bias signal-amplitude to use for the pulse position based approach. However, if we use the optimization criterion from the previous section we can numerically study how the variance of the estimator depends on the amplitude and derive the most appropriate bias signal. In FIG. 7 we see how the system performance becomes worse with increasing amplitude but significantly increases if the amplitude decreases near the suprathreshold limit.

Figure 8:
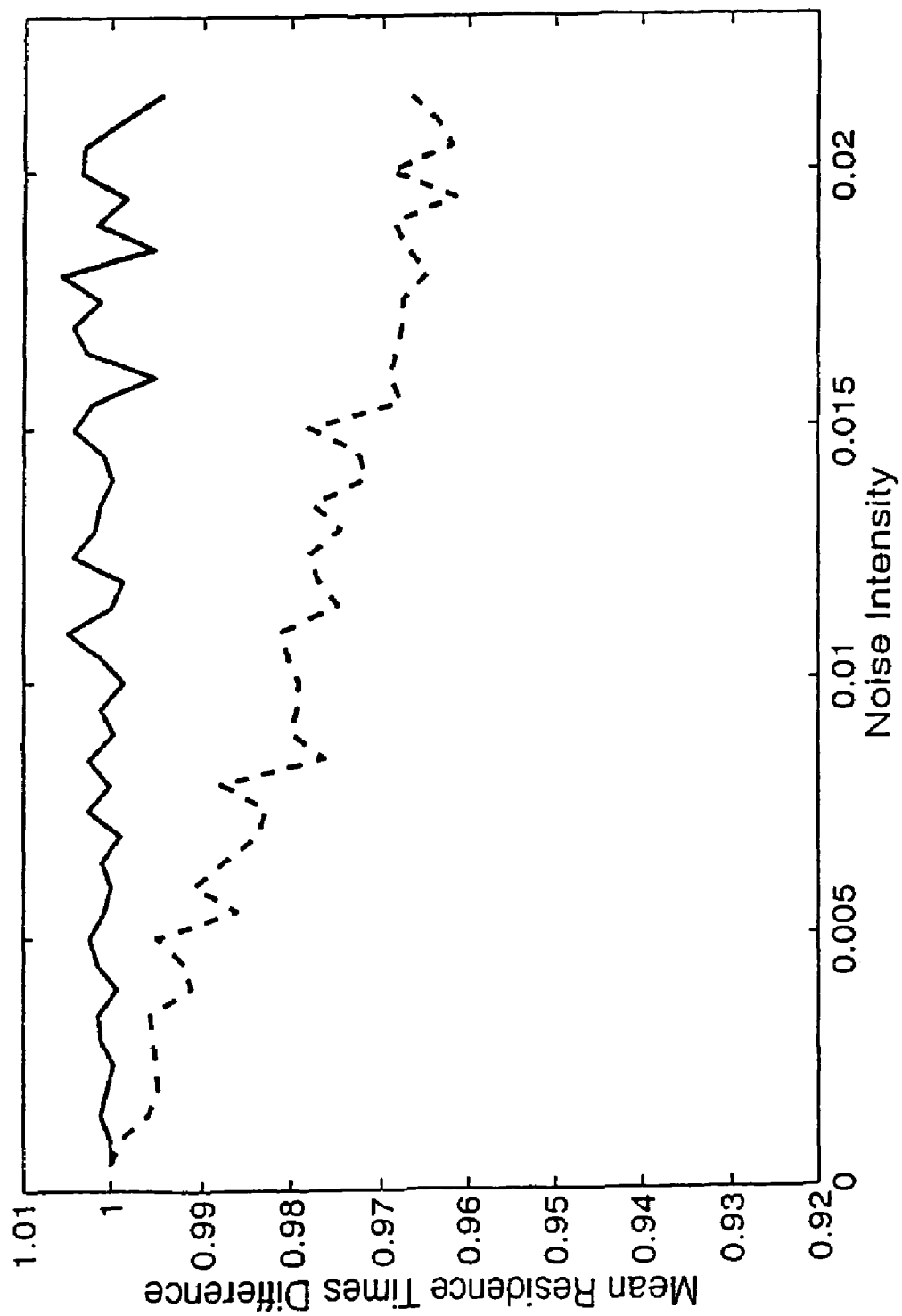
FIG. 8 shows the mean residence times difference, relative to the residence times difference for a system without an applied noise, versus noise intensity $\sigma^2$. The system parameters are a =1, b=⅙, $\omega=2\pi\cdot 0.01$ and $H^{ext}$=0.04. The solid line is for a triangular input and the dashed line is for a sinusoid input, both with an amplitude $H^{amp}$=1.5.

Since the perturbation theory is applied, the results shown so far are only valid under a small noise assumption. If we apply the optimal switching times based estimator for a situation with large noise serious problems will arise, since an increased noise intensity does not just increase the width of the switching time pdf:s, it also displaces the mean values. Hence, the optimal approach, based on displacements of the mean values, tends to be very sensitive to large noise levels. The alternative approach, based on the difference of residence times, is less sensitive since all switching time pdf:s are similarly displaced. However, since an applied target signal makes the two mean switching times for the system occur at times corresponding to different values of the derivative of the sinusoid, the two switching times pdf:s will be slightly differently displaced when the noise level is increased. For large unknown noise levels the sinusoid approach may therefore be inappropriate, but there are other alternatives. If we e.g. choose a locally linear bias signal such as a triangular wave, the technique becomes much more robust against an increased noise level. Even though we can not use the perturbation and performance analysis in this region, FIG. 8 clearly shows that the problems mentioned disappear with a triangular wave input, and the pulse position based approaches will be applicable also for higher noise intensities.

Figure 9:
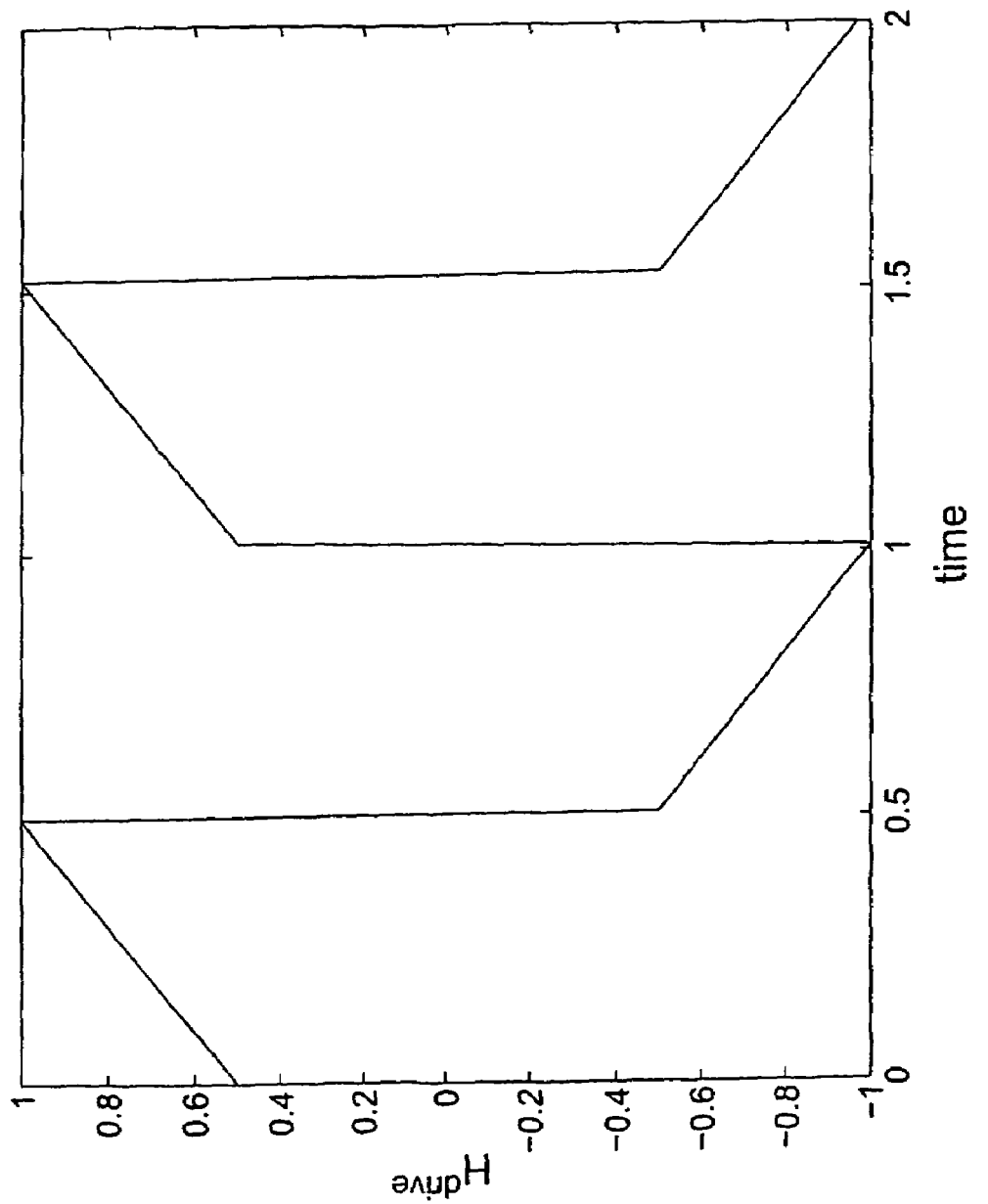
FIG. 9 shows an example of a bias signal $H^{drive}$ which is a superposition of a square wave and a triangular wave.

An example of a stepwise linear bias signal waveform, which is even more suitable than the triangular signal, is a superposition of a square wave and a triangular wave. The stepwise linearity of the signal will make a sensor driven by this signal work even for large noise levels. An example of a signal $H^{drive}$ of this class is found in FIG. 9. Note though that the relation between the amplitudes of the square wave and the triangular wave can be different than in the figure ($H^{drive}$ in kilo Ampere per meter, time in milliseconds). It is important, however, that the square wave amplitude is smaller than the critical amplitude needed to produce crossings in the system. The derivative of the bias signal when the crossings of the system occur will always be smaller for the superpositioned signal than for a conventional triangular wave having the same amplitude and periodic time as the superpositioned signal. Hence, the mean difference of residence times corresponding to the applied target signal will be larger for the superpositioned signal than for a conventional triangular signal. A superposition of a square wave and a triangular wave therefore gives a sensor that is robust against large noise levels and that has a better sensitivity than sensors driven with just a triangular input. The amplitude of this bias signal could be subthreshold to lower the power consumption, but suprathreshold amplitudes can give a better sensitivity.

The invention being thus described, it will be apparent that the same may be varied in many ways. Such variations are not to be regarded as a departure from the spirit and scope of the invention, and all such modifications as would be recognized by one skilled in the art are intended to be included within the scope of the following claims.

The invention claimed is:

1. A method of estimating target signals (dc or low frequency signals) by a dynamical fluxgate sensor, comprising pre-biasing the sensor with a periodic bias signal including a triangular wave, and analyzing the change in residence time statistics in the stable state of the sensor.

2. The method of claim 1 wherein the periodic bias signal is a superposition of a square wave and a triangular wave.

3. The method of claim 1 wherein the periodic bias signal has an amplitude that is lower than twice the hysteresis loop-width.

4. The method of claim 3 wherein the periodic bias signal has an amplitude ranging from slightly suprathreshold to zero.

5. The method of claim 1 wherein the mean difference of residence times is used to estimate the target signal.

6. The method of claim 1 wherein the difference of the measured residence times and the expected residence times for zero target signal are used to estimate the target signal.

7. A low-power dynamical magnetometer, comprising a pre-biasing system for prebiasing the magnetometer with a periodic bias signal having a triangular wave, and an analyzing system for analyzing the change in residence time statistics in the stable state of the sensor.

8. The low-power dynamical fluxgate magnetometer of claim 7 wherein the periodic bias signal is a superposition of a square wave and a triangular wave.

9. The low-power dynamical fluxgate magnetometer of claim 7 wherein the prebiasing system is pre-biasing the magnetometer with a periodic bias signal having an amplitude that is lower than twice the hysteresis loop-width.

10. The low-power dynamical fluxgate magnetometer of claim 9 wherein the prebiasing system is pre-biasing the magnetometer with a periodic bias signal having an amplitude ranging from slightly suprathreshold to zero.

11. The low-power dynamical fluxgate magnetometer of claim 7 wherein the analyzing system is using the mean difference of residence times to estimate the target signal.

12. The low-power dynamical fluxgate magnetometer of claim 7 wherein the analyzing system is using the difference of the measured residence times and the expected residence times for zero target signal to estimate the target signal.

13. The method of claim 2 wherein the periodic bias signal has an amplitude that is lower than twice the hysteresis loop-width.

14. The method of claim 13 wherein the periodic bias signal has an amplitude ranging from slightly suprathreshold to zero.

15. The method of claim 2 wherein the mean difference of residence times is used to estimate the target signal.

16. The method of claim 2 wherein the difference of the measured residence times and the expected residence times for zero target signal are used to estimate the target signal.

17. The low-power dynamical fluxgate magnetometer of claim 8 wherein the prebiasing system is pre-biasing the magnetometer with a periodic bias signal having an amplitude that is lower than twice the hysteresis loop-width.

18. The low-power dynamical fluxgate magnetometer of claim 7 wherein the prebiasing system is pre-biasing the magnetometer with a periodic bias signal having an amplitude ranging from slightly suprathreshold to zero.

19. The low-power dynamical fluxgate magnetometer of claim 8 wherein the analyzing system is using the mean difference of residence times to estimate the target signal.

20. The low-power dynamical fluxgate magnetometer of claim 8 wherein the analyzing system is using the difference of the measured residence times and the expected residence times for zero target signal to estimate the target signal.

* * * * *